United States Patent [19]

Kojima et al.

[11] Patent Number: 5,764,531
[45] Date of Patent: Jun. 9, 1998

[54] SIZING APPARATUS FOR ACTIVE DEVICES OF INTEGRATED CIRCUITS AND SIZING METHOD THEREFOR

[75] Inventors: Naohito Kojima; Masaaki Yamada, both of Yokohama, Japan

[73] Assignee: Kabushiki Kaisha Toshiba, Kawasaki, Japan

[21] Appl. No.: 616,991

[22] Filed: Mar. 14, 1996

[30] Foreign Application Priority Data

Mar. 14, 1995 [JP] Japan ................... 7-054563
Jan. 19, 1996 [JP] Japan ................... 8-007744

[51] Int. Cl.⁶ ........................................ G06F 17/50
[52] U.S. Cl. ........................... 364/490; 364/489
[58] Field of Search ........................... 364/488, 489, 364/490, 491

[56] References Cited

U.S. PATENT DOCUMENTS

| | | | |
|---|---|---|---|
| 4,698,760 | 10/1987 | Lembach et al. | 364/490 |
| 4,827,428 | 5/1989 | Dunlop et al. | 364/491 |
| 5,392,221 | 2/1995 | Donath et al. | 364/489 |
| 5,459,673 | 10/1995 | Carmean et al. | 364/489 |
| 5,619,418 | 4/1997 | Blaauw et al. | 364/489 |

Primary Examiner—Vincent N. Trans
Attorney, Agent, or Firm—Foley & Lardner

[57] ABSTRACT

A sizing apparatus for active devices of an integrated circuit has a storage unit for storing information about connections between the active devices and a delay constraint, a size initializing unit for initializing a size of the active device to a minimum value, an electric current consumption change rate arithmetic unit for calculating a change rate of an electric current or power consumption when the size is increased, a delay calculating unit for calculating a maximum signal delay by analyzing a timing on the basis of the connecting formation, a delay constraint judging unit for judging whether or not a maximum signal delay satisfies the delay constraint, a critical path extracting unit for extracting a critical path from paths that do not satisfy the delay constraint, a delay improvement arithmetic unit for calculating an improvement rate of the signal delay of the critical path with respect to a variation quantity of the electric current or power consumption when increasing the size of the active device, a selecting unit for selecting the active device having the maximum improvement rate and a control unit for selecting a minimum change rate of the electric current or power consumption and making the delay calculating unit calculate a signal delay when increasing the size of the active device in accordance with the selected change rate.

11 Claims, 7 Drawing Sheets

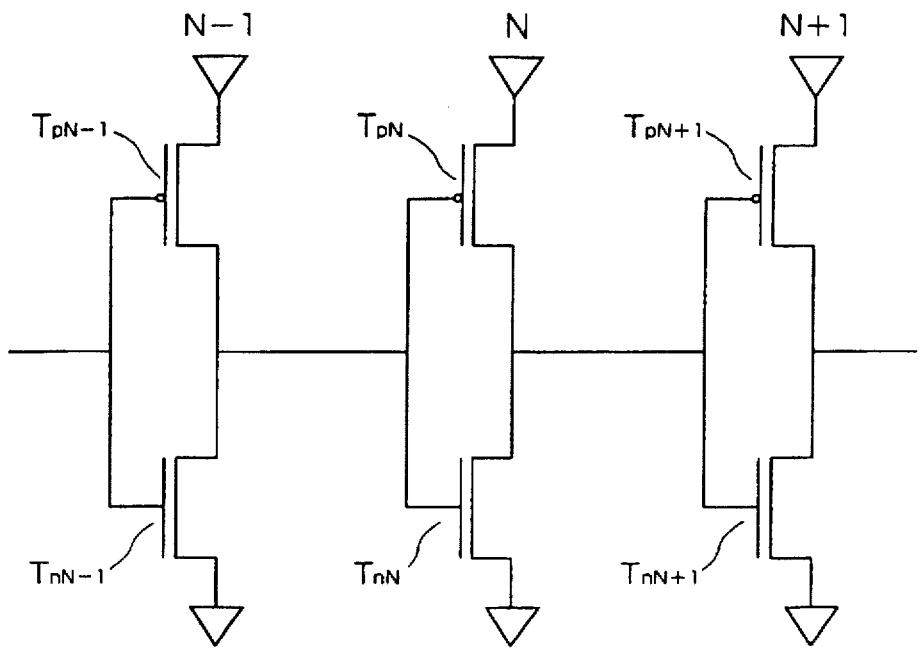
F I G. 3A
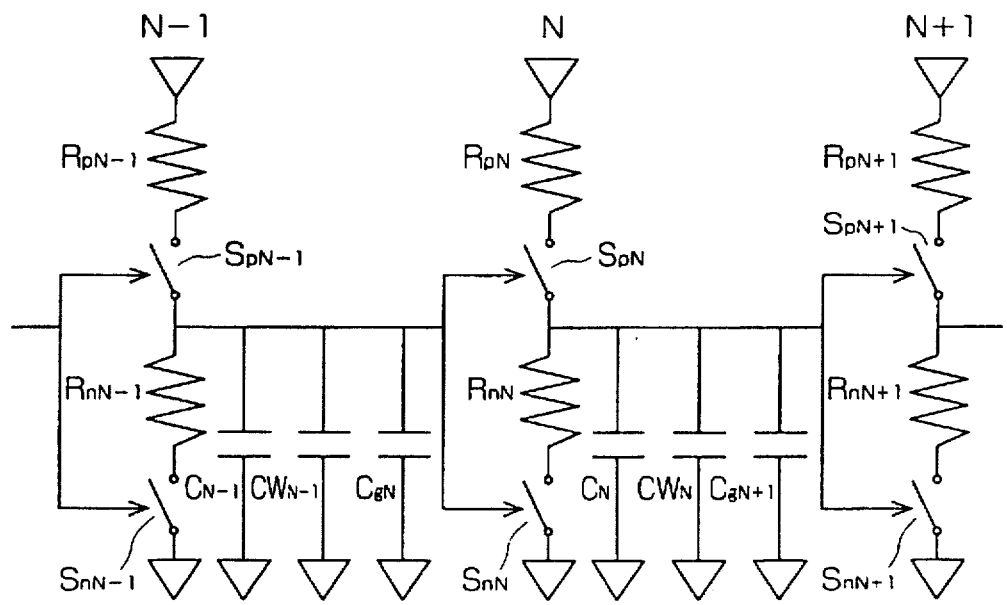
F I G. 3B

SIZING APPARATUS FOR ACTIVE DEVICES OF INTEGRATED CIRCUITS AND SIZING METHOD THEREFOR

BACKGROUND OF THE INVENTION

The present invention relates generally to an active device in an integrated circuit under a predetermined constraint and, more particularly to an active device sizing apparatus for and an active device sizing method of optimally designing a size of a MIS (Metal Insulation Semiconductor) transistor.

A size (a gate width in the case of a MOS transistor and a size of an emitter in the case of a bipolar transistor) of a transistor within a semiconductor integrated circuit has hitherto been chosen to minimize a total value of sizes of the transistors such that all paths of the integrated circuit must meet a signal delay constraint (see U.S. Pat. No. 4,827,428).

The operation of such a prior art transistor sizing apparatus will be explained with reference to a flowchart of FIG. 6 and a schematic diagram of FIG. 7 as well.

Now, there is considered such an integrated circuit that the active devices and connections between these active devices, and, referring to FIG. 7, there is schematically illustrated an example of this integrated circuit. Referring again to FIG. 7, the reference numeral 51 designates an input terminal, the reference numerals 61–69 represent transistors, 71–83 denote wiring lines, and 91 and 92 indicate output terminals. Herein, sizes of the transistors 61–69 are not yet determined. The wiring line 71, the transistor 61, the wiring line 72, the transistor 62, the wiring line 73, the transistor 63, the wiring line 74, the transistor 64 and the wiring line 75 form one path, e.g., a path A. The wiring line 76, the transistor 65, the wiring line 77, the transistor 66 and the wiring line 78 form another path, e.g., a path B. It is assumed that a signal delay constraint is previously given to each of these paths.

In such circumstances, the sizes of all the transistors of the integrated circuit are set to a minimum value (see step F41 in FIG. 6). Note that this minimum value is a value determined from a manufacturing process of the integrated circuit.

Extracted next is one path (hereinafter referred to as a critical path) in which the extent of not satisfying the given signal delay constraint is maximum (see step F43). If it is assumed that the signal delay of, e.g., the path A is 11 ns while the constraint thereof is 8 ns and that the signal delay of the path B is 10 ns while the constraint thereof is 6 ns, though the absolute signal delay of the path A is larger than the path B, when considering differences between the signal delays, and the constraints, the path B has a larger difference, wherein the path A is 3 ns and the path B is 4 ns. Thus, the path with the larger actual difference between the signal delay and the constraint is set as a path with a larger degree of not satisfying the signal delay constraint, and, in step F43, one path with the maximum degree, i.e., the critical path is extracted.

With respect to each of the transistors $i$ on the critical path, an improvement quantity $\Delta T_i$ of a signal delay time when assuming that a width is increased by a minute quantity $\Delta W$ is analyzed, and a transistor exhibiting a maximum delay improvement degree $\Delta T_i / \Delta W$ per increment quantity is extracted (see step F45).

In step F47, the width of the transistor extracted in step F45 is increased by $\Delta W$, thus improving the delay. Thereafter, whether or not there exists a path that does not satisfy the delay constraint is analyzed. If there exists such a path, the processing returns to step F43, wherein above steps are repeated. Whereas if there exists no such path, it is assumed that all the paths meet the delay constraint, and a transistor sizing process is completed (see step F49).

As explained above, the top priority is to minimize the total of the transistor sizes under the signal delay constraint, and hence the on-path transistor on which the signal delay constraint is not imposed or a considerably slackened constraint is imposed has the minimum size allowable in terms of design. Owing to this, a parasitic capacity of the transistor itself is minimized, and the charging/discharging current of the circuit can be therefore restrained small. In the conventional transistor sizing apparatus, it is assumed that the charging/discharging current of the circuit occupies the majority of all the electric current consumption. Accordingly, minimization of the total of the transistor sizes is set as an objective function, thereby aiming at indirectly reducing the electric current consumption of the circuit.

A short-circuit current parallel to the charging/discharging current can not be ignored as an element constituting the consumed electric current of the electronic circuit operating at a high speed.

An I/O signal of the electric circuit is not an ideal step signal but requires a minute time ($\tau$) to rise and fall. Let A be a current voltage, and a voltage rising rate known as a slew rate is expressed by $A/\tau$ in a graph (see FIG. 8), wherein the time is taken on the axis of abscissa, the voltage is taken on the axis of ordinate, and a relationship of the time versus the input signal is one-dimensionally approximated. Herein, $\tau$ is known as a slewing period. The short-circuit current is generated due to the slewing period. With a reduction in a clock period of the circuit of recent years, a rate of the slewing period to the clock period is not ignored.

Furthermore, if a given transistor has a remarkably small size as compared with a magnitude of the capacity for actuation, there must be a lack of capability enough to actuate the one of the next stage, and the slewing period increases with the result that a quantity of the short-circuit current augments. In the case of using the prior art transistor sizing apparatus, the transistor comes to have the minimum size satisfying the signal delay. However, the sizing is performed without taking the slewing period and the short-circuit current into consideration, and consequently there is produced such a drawback that the electric current consumption is not minimized even by reducing the transistor size.

Further, the integrated circuits which will be designed from now on are expected to be mounted in portable electronic appliances actuated by battery cells, and the most preferential condition is to decrease the electric power consumption while the priority of minimizing the total of the transistor sizes drops down. Accordingly, it has been considered improper that the electronic circuit sized by the conventional transistor sizing apparatus is mounted in the portable electronic appliance actuated by the battery cell. A transistor sizing apparatus with its most preferential object of minimizing the electric current consumption is therefore needed.

SUMMARY OF THE INVENTION

It is a primary object of the present invention, which was conceived under such circumstances, to provide a sizing apparatus for active devices of an integrated circuit and a sizing method therefor that are capable of satisfying a signal delay constraint and reducing an electric current consumption to the greatest possible degree.

According to a first aspect of the present invention, a sizing apparatus for active devices of an integrated circuit comprises a storage means for storing active devices constituting the integrated circuit, information about connections between the active devices and a delay constraint, a size initializing means for initializing a size of the active device to a minimum value, an electric current consumption change rate arithmetic means for calculating a change rate of an electric current consumption of the integrated circuit when the size of the active device is increased, a delay calculating means for calculating a maximum signal delay of a signal reaching each of the active devices of a last stage by analyzing a timing on the basis of the connecting information, a delay constraint judging means for judging whether or not a maximum signal delay of the signal reaching the active device of the last stage that has been calculated by the delay calculating means satisfies the delay constraint, a critical path extracting means for extracting a critical path from paths that do not satisfy the delay constraint, a delay improvement arithmetic means for calculating an improvement rate of the signal delay of the critical path with respect to a variation quantity of the electric current consumption of the integrated circuit when increasing the sizes of the respective active devices on the critical path, a selecting means for selecting the active device having the maximum improvement rate and a control means for selecting a minimum change rate of the electric current consumption, making the electric current consumption change rate arithmetic means calculate a change rate of the electric current when increasing the size of the corresponding active device if the selected change rate is zero or less, making the delay calculating means calculate a signal delay of each path if the selected change rate exceeds zero, making the delay improvement rate arithmetic means calculate a delay improvement rate if there exists a critical path and making the delay calculating means calculate a signal delay when increasing the size of the active device that has been selected by the selecting means.

According to a second aspect of the present invention, a sizing method for active devices of an integrated circuit comprises a first step of setting sizes of the active devices constituting the integrated circuit to minimize an electric current consumption of the integrated circuit, a second step of judging whether or not there exists a path that does not satisfy a delay constraint by calculating a signal delay of the path and, if there exists no such path, finishing a sizing process, a third step of extracting such a critical path that a degree of not satisfying the delay constraint is maximum, a fourth step of selecting the active device with a maximum improvement rate of a signal delay to a variation in the electric current consumption when increasing a size of the active device on the critical path and a fifth step of executing the second step by increasing the size of the selected active device.

According to a third aspect of the present invention, a sizing apparatus for active devices of an integrated circuit comprises a storage means for storing active devices constituting the integrated circuit, information about connections between the active devices and a delay constraint, a size initializing means for initializing a size of the active device to a minimum value, an electric power consumption change rate arithmetic means for calculating a change rate of an electric power consumption of the integrated circuit when the size of the active device is increased, a delay calculating means for calculating a maximum signal delay of a signal reaching each of the active devices of a last stage by analyzing a timing on the basis of the connecting information, a delay constraint means for judging whether or not a maximum signal delay of the signal reaching the active device of the last stage that has been calculated by the delay calculating means satisfies the delay constraint, a critical path extracting means for extracting a critical path from paths that do not satisfy the delay constraint, a delay improvement arithmetic means for calculating an improvement rate of the signal delay of the critical path with respect to a variation quantity of the electric power consumption of the integrated circuit when increasing the sizes of the respective active devices on the critical path, a selecting means for selecting the active device having the maximum improvement rate and a control means for selecting a minimum change rate of the electric power consumption, making the electric power consumption change rate arithmetic means calculate a change rate of the electric power when increasing the size of the corresponding active device if the selected change rate is zero or less, making the delay calculating means calculate a signal delay of each path if the selected change rate exceeds zero, making the delay improvement rate arithmetic means calculate a delay improvement rate if there exists a critical path and making the delay calculating means calculate a signal delay when increasing the size of the active device that has been selected by the selecting means.

According to a fourth aspect of the present invention, a sizing method for active devices of an integrated circuit comprises a first step of setting sizes of the active devices constituting the integrated circuit to minimize an electric power consumption of the integrated circuit, a second step of judging whether or not there exists a path that does not satisfy a delay constraint by calculating a signal delay of the path and, if there exists no such path, finishing a sizing process, a third step of extracting such a critical path that a degree of not satisfying the delay constraint is maximum, a fourth step of selecting the active device with a maximum improvement rate of a signal delay to a variation in the electric power consumption when increasing a size of the active device on the critical path and a fifth step of executing the second step by increasing the size of the selected active device.

BRIEF DESCRIPTION OF THE DRAWINGS

FIGS. 3A and 3B are explanatory diagrams each showing a method of obtaining a signal delay and an electric current consumption;

DESCRIPTION OF THE PREFERRED EMBODIMENTS

Figure 1:
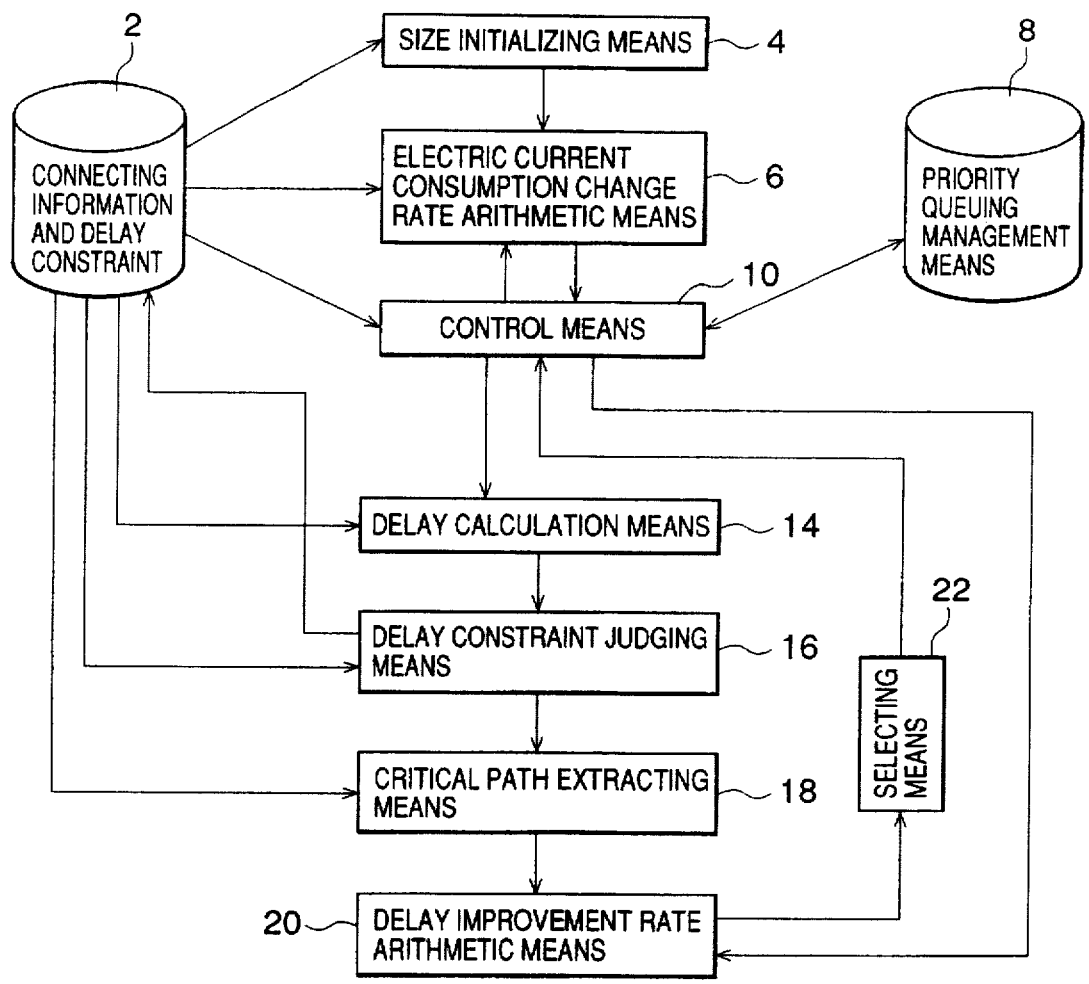
FIG. 1 is a block diagram illustrating a construction of a first embodiment of an active device sizing apparatus according to the present invention.

FIG. 1 illustrates a construction of a first embodiment of a sizing apparatus for an active device of an integrated circuit (which will hereinafter be simply called a sizing apparatus) according to the present invention. The sizing apparatus in this embodiment includes a connection data/delay constraint storage means 2, a size initializing means 4, an electric current consumption change rate arithmetic means 6, a priority queuing management means 8, a control means 10, a delay calculation means 14, a delay constraint judging means 16, a critical path extraction means 18, a delay improvement rate arithmetic means 20 and a selection means 22.

The connection data/delay constraint storage means (hereinafter simply referred to as a storage means) 2 is stored with active devices constituting an integrated circuit, data about connections between these active devices and a delay constraint. The size initializing means 4 sets, to a minimum value, a size (a gate width in the case of, e.g., a MOS transistor) of a transistor defined as the active device constituting the above integrated circuit. This minimum value is, as in the case of the prior art sizing apparatus, a value determined by a manufacturing process. The electric current consumption change rate arithmetic means (hereinafter simply termed an arithmetic means) 6 obtains a change rate $\Delta I/\Delta W$ of an electric current consumption I of the integrated circuit when a gate width W of the transistor is increased by a minute quantity $\Delta W$ in each transistor.

The priority queuing management means 8 manages a set of such pairs that the change rate $\Delta I/\Delta W$ of the electric current consumption is a key and pieces of individual information (name and size) of the transistor become data. The priority queuing management means 8 preferentially fetches such a pair that a value of the key is minimum and, if the key value is the same, fetches the pairs with the preference as they were accepted. The control means 10 transfers the electric current consumption change rate calculated by the arithmetic means 6 and the individual information on the transistor to the priority queuing management means 8 and makes the same means 8 manage them. The control means 10 judges whether or not the electric current consumption change rate relative to the transistor of the pair fetched out of the priority queuing management means 8 is zero or less and, if zero or less, increases the size of the above transistor by the minute quantity $\Delta W$. At this time, there fluctuate the electric current consumption change rates $\Delta I/\Delta W$ relative to the above transistor and the transistors peripheral thereto. The control means 10 therefore makes the arithmetic means 6 calculate the thus fluctuated electric current consumption change rates $\Delta I/\Delta W$, and queuing keys of the corresponding transistors are substituted into the calculated change rates $\Delta I/\Delta W$ and then sent to the priority queuing management means 8. Further, if the electric current consumption change rate is positive, the control means 10 makes the delay calculation means 14 calculate a signal delay of each path.

The delay calculation means 14 analyzes a timing and calculates a maximum signal delay of the signal reaching each transistor of the last stage. The delay constraint judging means 16 judges whether or not the calculated maximum signal delay of the signal reaching the transistor of the last stage meets the delay constraint stored in the storage means 2 and, if satisfied, finishes a sizing process. A present size of the transistor at that time satisfies the delay constraint and has the electric current consumption that is as small as possible.

The critical path extraction means 18 extracts such a path (critical path) as to exhibit a maximum degree (=signal delay−delay constraint) of not meeting the delay constraint. The delay improvement rate arithmetic means 20 obtains a variation quantity $\Delta I$ of the electric current consumption of the semiconductor integrated circuit when the size of each transistor is increased by the minute quantity $\Delta W$ and an improvement quantity $\Delta \tau$ of the signal delay and calculates an improvement rate $\Delta \tau/\Delta I$ of the signal delay to the variation quantity of the electric current consumption. The selection means 22 selects the transistor exhibiting the maximum improvement rate $\Delta \tau/\Delta I$ on the above critical path and sends it to the control means 10. Hereupon, the control means 10 increases, by the minute quantity $\Delta W$, the size of the transistor exhibiting the maximum improvement rate on the critical path and makes the delay calculation means 14 recalculate the signal delay of the critical path. At this time, there increase the electric current consumptions of the above transistor and the transistors peripheral thereto.

Note that a method of obtaining the signal delay and the electric current consumption of the integrated circuit from the size W of the transistor will be discussed with reference to FIGS. 3A and 3B before explaining the operation of the sizing apparatus in the above embodiment.

FIG. 3A is a diagram illustrating inverters of an (N−1)th stage through an (N+1)th stage counted from an input of an inverter chain within a certain circuit. FIG. 3B illustrates the transistors of FIG. 3A that, are modeled by a resistance and a capacitance. Herein $W_N$, $R_N$, $C_N$, $C_{gN}$ and $C_{wN}$ with respect to the inverters from the input down to the (N)th stage will be defined as follows.

$W_{pN}$: the size of a p-type transistor $T_{pN}$ constituting the inverter, $W_{nN}$: the size of an n-type transistor $T_{nN}$ constituting the inverters, $W_N$: the sum of sizes of the transistors constituting the inverters, $R_{pN}$: the resistance of the p-type transistor $T_{pN}$ constituting the inverter, $R_{nN}$: the resistance of the n-type transistor $T_{nN}$ constituting the inverter, $R_N$: the sum of average resistances of the transistors constituting the inverters, $C_N$: the sum of load capacitances of sources and drains of the transistors constituting the inverters, $C_{gN}$: the sum of gate load capacitances of the transistors constituting the inverters, and $C_{wN}$: the capacitance of a wired connected to an output stage of the inverter.

At this time, the following relationship between $W_N$, $R_N$, $C_N$ and $C_{gN}$ is to be established ($\alpha$ and $\beta$ are the proportional constants).

$$R_N = R_{pN} + R_{nN} = \alpha/W_{pN} + \beta/W_{nN}, C_N \propto W_N, C_{gN} \propto W_N$$

Shown next is a method of obtaining the signal delay of a certain path. The signal delay of a certain path is expressed by a total sum of the delays when the respective transistors are driven.

$\tau_N$: the signal delay (½ the rising/falling time of the output voltage) through the (N)th stage, $V_{THp}$: the threshold value voltage of the p-type transistor, and $V_{THn}$: the threshold value voltage of the n-type transistor.

Supposing that both of a probability of the inverter being turned ON and a probability of the inverter being turned OFF be ½, $\Sigma_N$ becomes an average of $\Sigma_{pN}$ and $\Sigma_{nN}$, where $\Sigma_p$ is the signal delay when turned ON, and $\Sigma_N$ is the signal delay when turned OFF.

Then, with the definitions given above, each of the delays ($\Sigma$) when driving the transistors from the (N−1)th stage on is obtained as follows based on "CMOS Circuit Speed and Buffer Optimization", N. Hedenstierna, K. O. Jeppson, IEEE Trans. Computer-Aided Design, Vol. CAD-6, pp.270–281, Mar., 1987.

$$\Sigma_N = (\Sigma_{pN} + \Sigma_{nN})/2$$

$$= (R_{pN}(C_N + C_{wN} + C_{gN+1}) + R_{nN}(C_N + C_{wN} + C_{gN+1}))/2$$

Based on the above formula, it is possible to obtain a variation quantity of the signal delay when the size of the transistor of the (N)th transistor.

Next, the electric current consumption is to be obtained. It is assumed that the electric current consumption of the circuit be a sum of a charging/discharging current and a short-circuit current. Then, the charging/discharging current and the short-circuit current are a charging/discharging electric charge quantity and a short-circuit electric charge quantity that flow per means time when switching each transistor, and hence, in the following calculation, the charging/discharging electric charge quantity and the short-circuit electric charge quantity are defined as below on the assumption that the charging/discharging current and the short-circuit current be the charging/discharging electric charge quantity and the short-circuit electric charge quantity.

$I_{dN}$: the charging/discharging electric charge quantity corresponding to the charging/discharging current flowing once through the inverter of the (N)th stage, and $I_{SCN}$: the short-circuit electric charge quantity corresponding to the short-circuit current flowing once through the inverter of the (N)th stage.

$$I_{dN}: Vdd(c_N + C_{gN} + 1 + C_{wN})$$

$$I_{SCN} = (\text{AverageShort-CircuitCurrentQuantity}) \times$$

(Time of p-type, n-type Transistors Being Simultaneously Turned ON) =

$$\left(\frac{Vdd}{R_N}\right) \times \left(2\tau_{N-1}\left(\frac{V_{THp}}{V_{dd}} - \frac{V_{THn}}{V_{dd}}\right)\right) = (V_{THp} - V_{THn})\frac{2\tau_{N-1}}{R_N}$$

Then, $I_{dN}$, $I_{SCN}$ can be expressed as below: where $V_{dd}$ is the power supply voltage.

On the basis of the above-explained, there is obtained a variation quantity of the electric current consumption when the size of the transistor of the (N)th stage.

Figure 2:
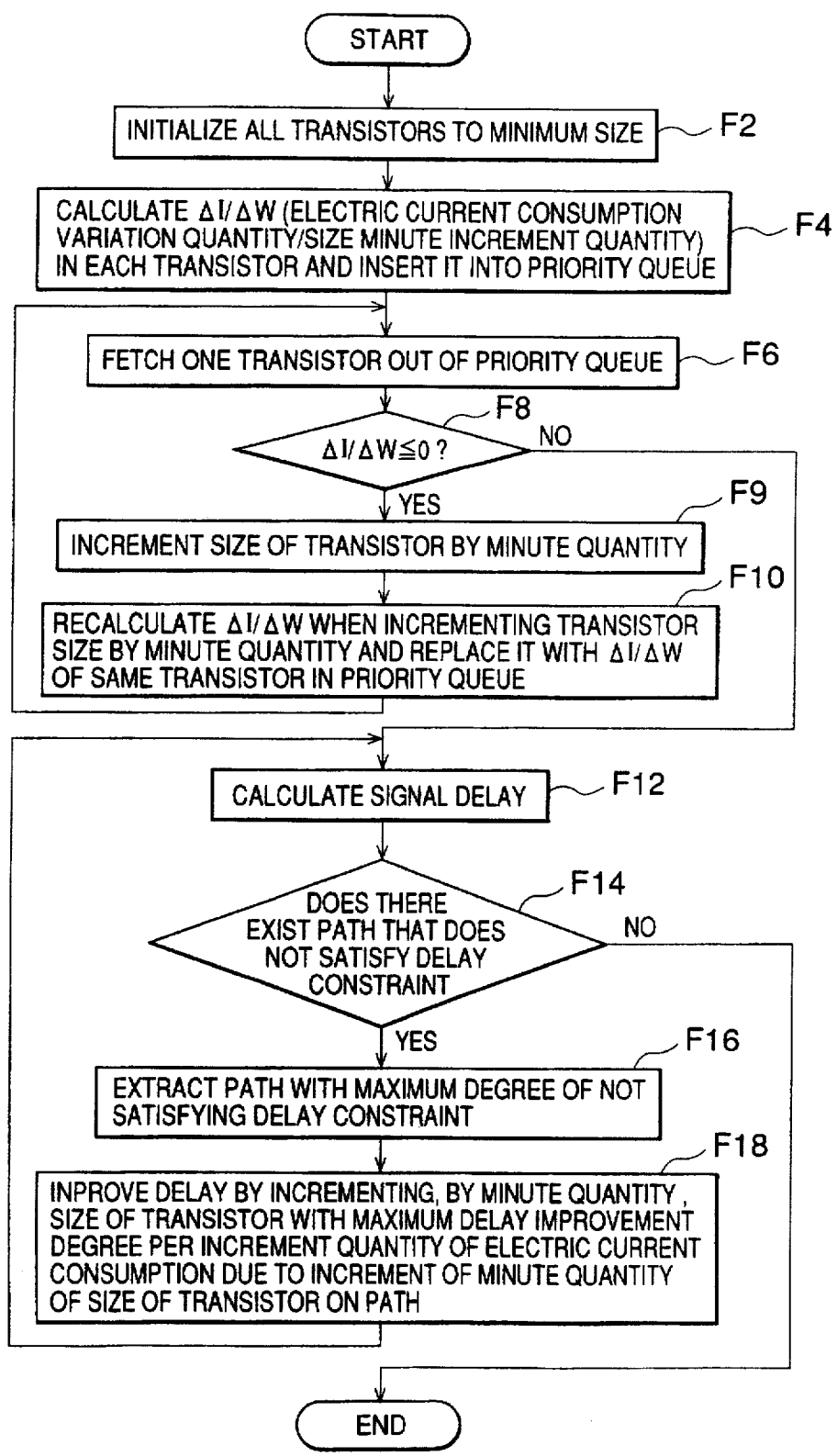
FIG. 2 is a flowchart of assistance in explaining the operation in the first embodiment.

Next, the operation of the sizing apparatus in the above embodiment will be described with reference to FIG. 2. To start with, all the transistors of the integrated circuit are set to a minimum size by use of the size initializing means 4 (see step F2). Subsequently, the electric current consumption change rate arithmetic means 6 calculates a change rate of the electric current consumption of the integrated circuit with respect to the variation quantity of the size W of each transistor of the integrated circuit (see step F4) and sends a value thereof to the control means 10. Hereupon, the control means 10 transmits, as a pair, the change rate and the individual information of the transistor corresponding to this change rate to the priority queuing management means 8 and makes the same means 8 manage them (see step F6). The priority queuing management means 8 holds the pairs managed by itself so that the pair having the minimum change rate of the electric current consumption can be easily taken out. Then, the priority queuing management means 8 transmits the pair having the minimum change rate among the thus managed pairs to the control means 10 (see step F6).

Hereupon, the control means 10 judges whether or not the change rate $\Delta I/\Delta W$ of the electric current consumption that is defined as a key of the pair transmitted is zero or less (see step F8). Then, if zero or less, the control means 10 increases the size of the corresponding transistor by the minute quantity $\Delta W$ (see step S9). Further, the control means 10 makes the electric current consumption change rate arithmetic means 6 calculate new change rates $\Delta I/\Delta W$ of the electric current consumptions of the integrated circuit with respect to the transistors peripheral to the above transistor, which might be attributed to the fact that the size of the above transistor is changed based on an item of connecting information stored in the storage means 2. Then, the control means 10 replaces those calculated values with the change rates of the keys of the of the pairs of the corresponding transistors (see step F10). Thereafter, the priority queuing management means 8 transmits the pair with the minimum change rate to the control means 10, and steps F6 and F8 described above are executed. With this execution, there are eliminated such pairs that the change rates of the electric current consumptions are zero or less. In step F8, if the change rate $\Delta I/\Delta W$ of the electric current consumption is positive, the processing proceeds to step F12.

In step F12, the delay calculation means 14 calculates the maximum signal delay of the signal reaching each transistor of the last stage. Subsequently, the delay constraint judging means 16 judges whether or not there exists a path that does not satisfy the delay constraint, i.e., such a condition that the signal delay is smaller than the delay constraint (see step S14). Then, if there exists the path that does not satisfy the delay constraint, the critical path extracting means 18 extracts such a path that the degree of not satisfying the delay constraint is maximum, i.e., the critical path. Subsequently, the delay improvement rate arithmetic means 20 obtains a rate of an improvement quantity of the signal delay of the path with respect to the variation quantity of the electric current consumption of the above path when the size of each transistor on the thus extracted critical path is increased by a minute quantity (see step F18). Then, the selection means 22 selects the transistor with the maximum improvement rate. Hereupon, the control means 10 increments the size of the selected transistor by the minute quantity $\Delta W$ (see step F18). Thereafter, the processing returns to step F12, wherein the control means 10 again makes the delay calculation means 14 calculate the signal delay. The electric current consumption of the extracted critical path is incremented by the minute quantity at that time, however, it follows that the signal delay is to be improved. Hereafter, steps F14, F16, F18 and F12 are repeated. Then, in step F14, when there exists no path that meets the delay constraint, the sizing process comes to an end.

As discussed above, in accordance with the embodiment, there is at first actualized such a combination of the transistor sizes as to minimize the electric current consumption, and, thereafter, the transistor is sized to minimize the increment of the electric current consumption, thereby satisfying the delay constraint condition. Hence, the size of the transistor is optimized to satisfy the delay constraint and minimize the electric current consumption. With this optimal size, the electric current consumption is also minimized under such an assumption that an actuation voltage of each transistor within the integrated circuit and a switching probability (a frequency at which a node voltage transition happens for one period of the clock signal inputted to the integrated circuit) of each node are all equal.

The integrated circuit designed based on the above-described method has characteristics which follow. That is, the integrated circuit includes an input terminal, an output terminal and active devices. Some active devices have sizes larger than the minimum size designated by a design rule. If the size of one of the active devices having their sizes larger than the minimum size is reduced, the construction is provided so that (1) the signal delay of the signal passing through a path from one input terminal sequentially via a plurality of active devices to one output terminal exceeds a designated maximum delay level, or (2) the electric current consumption of the whole circuit increases.

Figure 4:
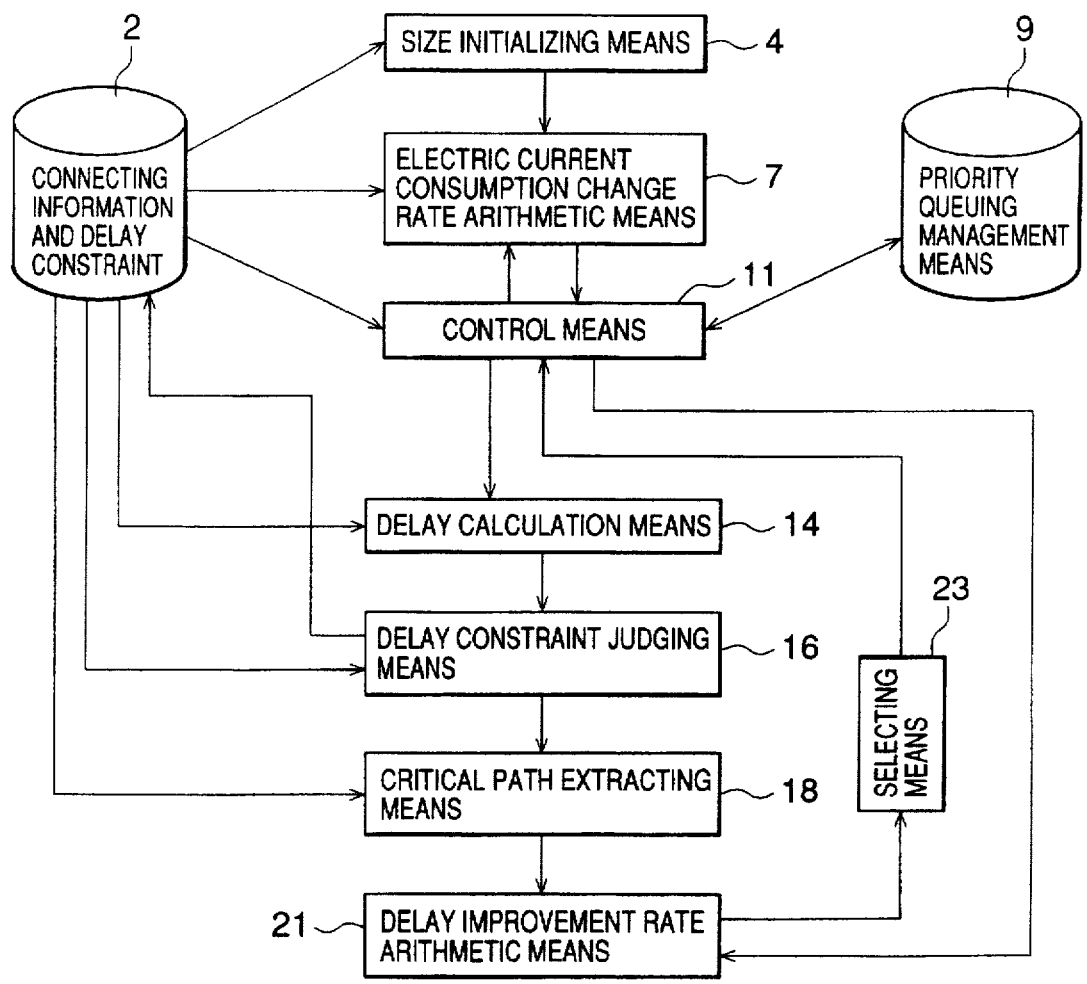
FIG. 4 is a block diagram illustrating a construction of a second embodiment of the active device sizing apparatus according to the present invention.

Next, FIG. 4 illustrates a construction of a second embodiment of the sizing apparatus according to the present invention. The sizing apparatus in the second embodiment includes an electric current consumption change rate arithmetic means 7, a priority queuing management means 9, a control means 11, a delay improvement rate arithmetic means 21 and a selection means in stead of the electric current consumption change rate arithmetic means 6, the priority queuing management means 8, the control means 10, the delay improvement rate arithmetic means 21 and the selection means 23 that are provided in the sizing apparatus in accordance with the first embodiment shown in FIG. 1.

The electric current consumption change rate arithmetic means (hereafter referred to as an arithmetic means) 7 obtains a change rate $\Delta I/\Delta W$ of an electric current consumption P of the integrated circuit when a gate width W of the transistor is increased by a minute quantity $\Delta W$ in each transistor.

The priority queuing management means 9 manages a set of such pairs that the change rate $\Delta P/\Delta W$ of the electric current consumption is a key and pieces of individual information (name and size) of the transistor become data. The priority queuing management means 9 preferentially fetches such a pair with the minimum key value and, if the key value is the same, fetches the pairs with the preference as they were accepted. The control means 11 transfers the electric current consumption change rate calculated by the arithmetic means 7 and the individual information on the transistor to the priority queuing management means 9 and makes the same means 9 manage them. The control means 11 judges whether or not the electric current consumption change rate relative to the transistor of the pair fetched out of the priority queuing management means 9 is zero or less and, if zero or less, increases the size of the above transistor by the minute quantity $\Delta W$. At this time, there fluctuate the electric current consumption change rates $\Delta P/\Delta W$ relative to the above transistor and the transistors peripheral thereto. The control means 11 therefore makes the arithmetic means 7 calculate the thus fluctuated electric current consumption change rates $\Delta P/\Delta W$, and queuing keys of the corresponding transistors are substituted into the calculated change rates $\Delta P/\Delta W$ and then sent to the priority queuing management means 9. Further, if the electric current consumption change rate is positive, the control means 11 makes the delay calculation means 14 calculate a signal delay of each path.

The delay improvement rate arithmetic means 20 obtains a variation quantity $\Delta P$ of the electric current consumption of the integrated circuit when the size of each transistor is increased by the minute quantity $\Delta W$ and an improvement quantity $\Delta \Sigma$ of the signal delay and calculates an improvement rate $\Delta \Sigma/\Delta P$ of the signal delay to the variation quantity of the electric current consumption. The selection means 22 selects the transistor exhibiting the maximum improvement rate $\Delta \Sigma/\Delta P$ on the above critical path and sends it to the control means 11. Hereupon, the control means 11 increases, by the minute quantity $\Delta W$, the size of the transistor exhibiting the maximum improvement rate on the critical path and makes the delay calculation means 14 recalculate the signal delay of the critical path. At this time, there increase the electric current consumptions of the above transistor and the transistors peripheral thereto.

Next, a method of obtaining the variation quantity of the electric current consumption will be described before explaining the operation of the sizing apparatus in this embodiment. Note that obtaining the signal delay of the integrated circuit from the size W of the transistor involves the method described in the first embodiment. a variation quantity $\Delta P_N$ of the electric current consumption when changing the size of the transistor of the (N)th stage is obtained by acquiring at first a variation quantity $\Delta I_N$ of the electric current consumption of the transistor of the (N)th stage. The variation quantity $\Delta P_N$ is given by:

$$\Delta P_N = \Delta I_N \bullet V \bullet p \bullet f/2$$

where $V_N$ is the actuation voltage of the above transistor, f is the operating frequency of the integrated circuit, and p is the switching probability of the node actuated by the transistor.

Figure 5:
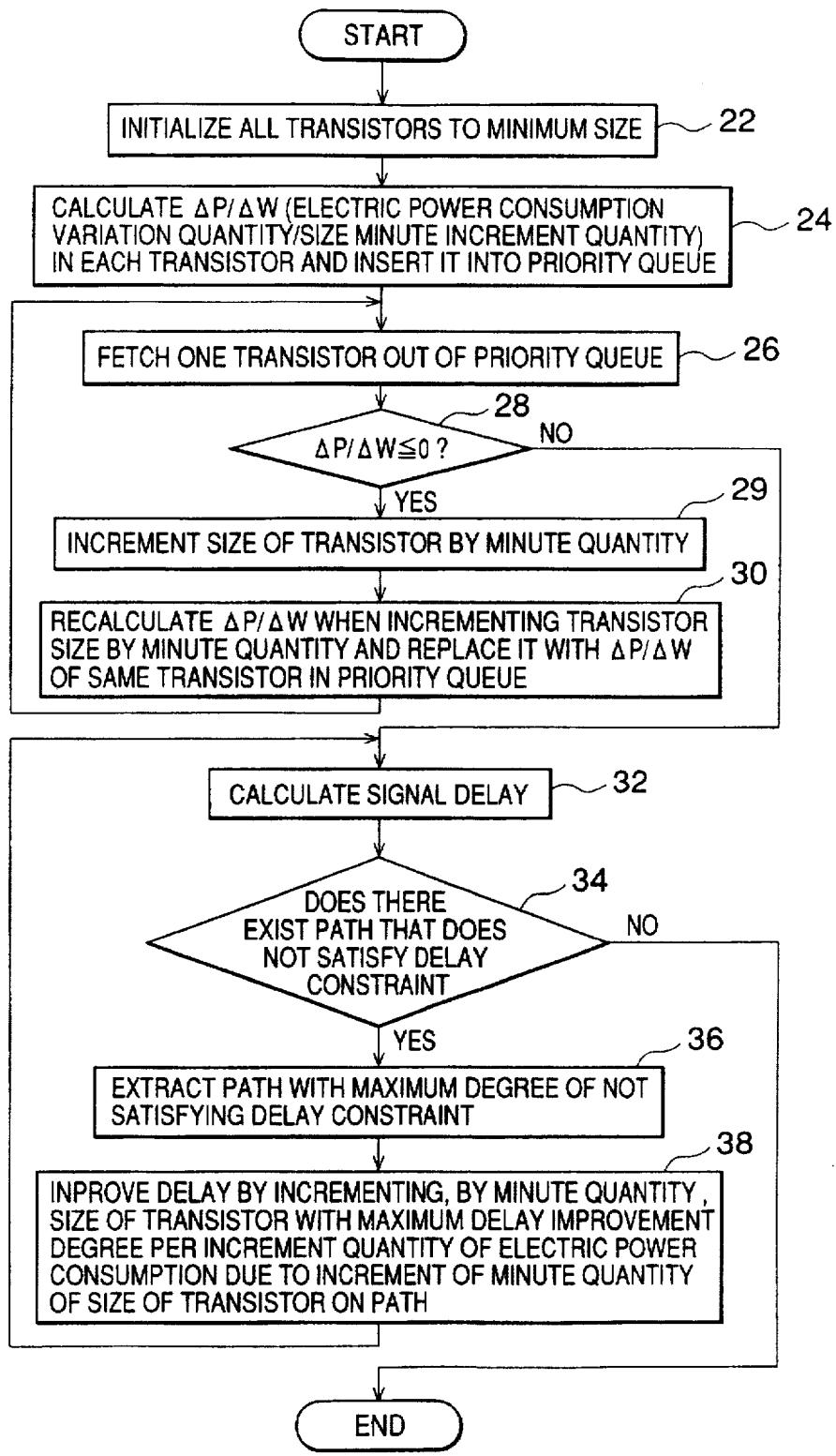
FIG. 5 is a flowchart of assistance in explaining the operation in the second embodiment.
Figure 6:
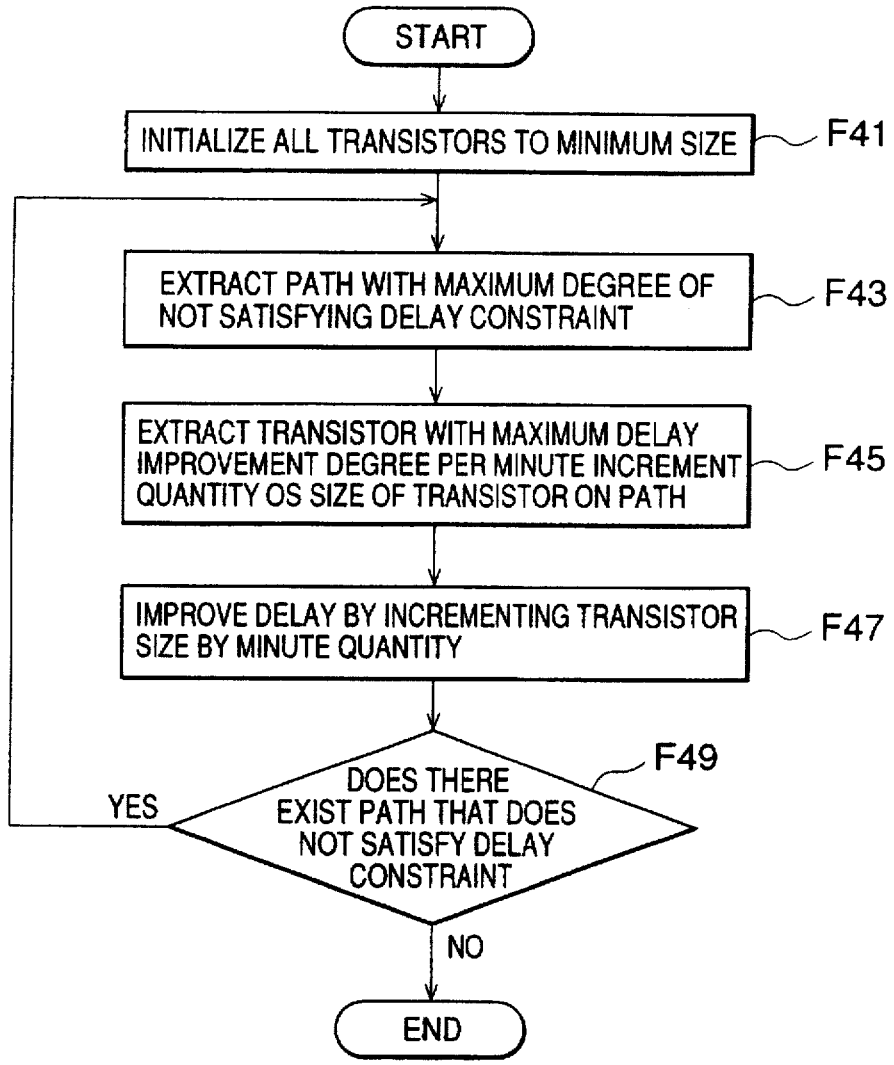
FIG. 6 is a flowchart of assistance in explaining the operation of a prior art transistor sizing apparatus.
Figure 7:
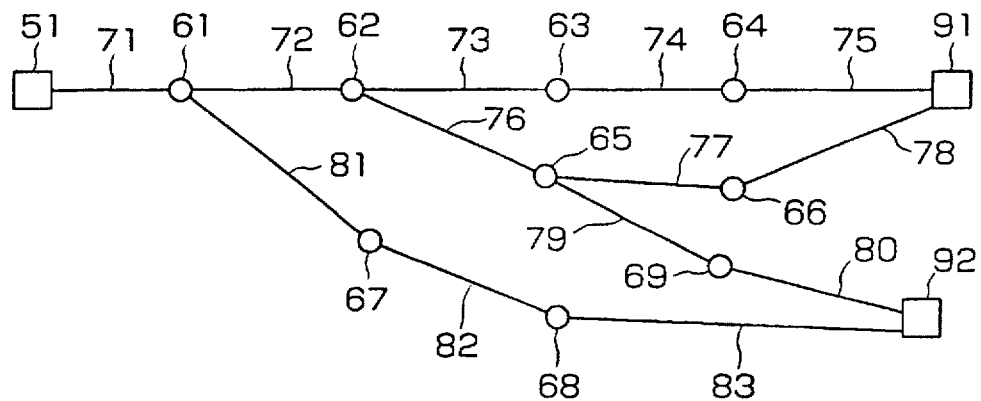
FIG. 7 is a schematic diagram of a semiconductor integrated circuit.
Figure 8:
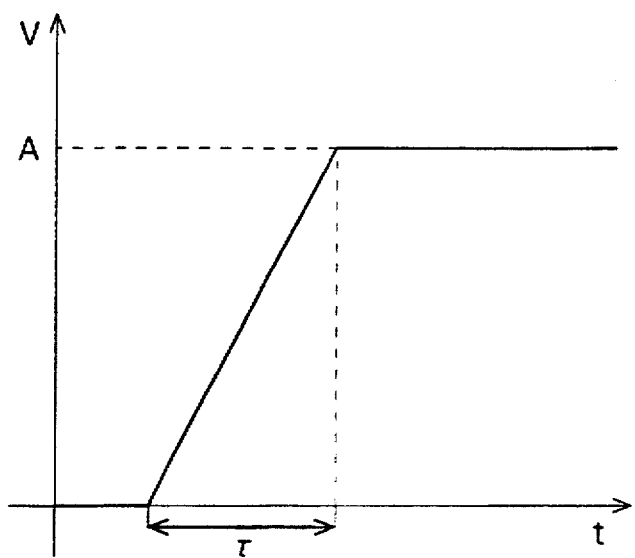
FIG. 8 is a graph of assistance explaining a slew rate of an input signal.

Next, the operation of the sizing apparatus in this embodiment will be explained with reference to FIG. 5.

To start with, the size initializing means 4 sets all the transistors of the integrated circuit to the minimum size (see step F22). Subsequently, the electric current consumption change rate arithmetic means 7 calculates the change rate of the electric current consumption of the integrated circuit with respect to the change quantity $\Delta W$ of the size W of each transistor of the integrated circuit (see step F24) and sends this value to the control means 11. Hereupon, the control means 11 transmits, as a pair, the change rate and the individual information of the transistor corresponding to this change rate to the priority queuing management means 9 and makes the same means 9 manage them (see step F26). The priority queuing management means 9 holds the pairs managed by itself so that the pair having the minimum change rate of the electric current consumption can be easily taken out. Then, the priority queuing management means 9 transmits the pair having the minimum change rate among the thus managed pairs to the control means 11 (see step F26).

Hereupon, the control means 11 judges whether or not the change rate $\Delta P/\Delta W$ of the electric current consumption that is defined as a key of the pair transmitted is zero or less (see step F28). Then, if zero or less, the control means 11 increases the size of the corresponding transistor by the minute quantity $\Delta W$ (see step S29). Further, the control means 11 makes the electric current consumption change rate arithmetic means 7 calculate new change rates $\Delta P/\Delta W$ of the electric current consumptions of the integrated circuit with respect to the transistors peripheral to the above transistor, which might be attributed to the fact that the size of the above transistor is changed based on an item of connecting information stored in the storage means 2. Then, the control means 11 replaces those calculated values with the change rates of the keys of the pairs of the corresponding transistors (see step F30). Thereafter, the priority queuing management means 9 transmits the pair with the minimum change rate to the control means 11, and steps F26 and F28 described above are executed. With this execution, there are eliminated such pairs that the change rates of the electric current consumptions are zero or less. In step F28, if the change rate $\Delta P/\Delta W$ of the electric current consumption is positive, the processing proceeds to step F32.

In step F32, the delay calculation means 14 calculates the maximum signal delay of the signal reaching each transistor of the last stage. Subsequently, the delay constraint judging means 16 judges whether or not there exists a path that does not satisfy the delay constraint, i.e., such a condition that the signal delay is smaller than the delay constraint (see step S34). Then, if there exists the path that does not satisfy the delay constraint, the critical path extracting means 18 extracts such a path that the degree of not satisfying the delay constraint is maximum, i.e., the critical path. Subsequently, the delay improvement rate arithmetic means 21 obtains a rate of an improvement quantity of the signal delay of the path with respect to the variation quantity ΔP of the electric current consumption of the above path when the size of each transistor on the thus extracted critical path is increased by a minute quantity (see step F38). Then, the selection means 23 selects the transistor with the maximum improvement rate. Hereupon, the control means 11 increments the size of the selected transistor by the minute quantity ΔW (see step F38). Thereafter, the processing returns to step F12, wherein the control means 11 again makes the delay calculation means 14 calculate the signal delay. The electric current consumption of the extracted critical path is incremented by the minute quantity at that time, however, it follows that the signal delay is to be improved. Hereafter, steps F34, F36, F38 and F32 are repeated. Then, in step F34, when there exists no path that meets the delay constraint, the sizing process comes to an end.

As discussed above, in accordance with this embodiment, there is at first actualized such a combination of the transistor sizes as to minimize the electric current consumption, and, thereafter, the transistor is sized to minimize the increment of the electric current consumption, thereby satisfying the delay constraint condition. Hence, the size of the transistor is optimized to satisfy the delay constraint and minimize the electric current consumption. With this optimal size, the electric current consumption is also minimized under such an assumption that an actuation voltage of each transistor within the integrated circuit and a switching probability (a frequency at which a node voltage transition happens for one period of the clock signal inputted to the integrated circuit) of each node are all equal.

The integrated circuit designed based on the above-described method has characteristics which follow. That is, the integrated circuit includes the input terminal, the output terminal and the active devices. Some active devices have sizes larger than the minimum size designated by the design rule. If the size of one of the active devices having their sizes larger than the minimum size is reduced, the construction is provided so that (1) the signal delay of the signal passing through the path from one input terminal sequentially via the plurality of active devices to one output terminal exceeds the designated maximum delay level, or (2) the electric current consumption of the whole circuit increases.

Note that the sizing apparatus in accordance with the second embodiment is used, as a matter of course, for the integrated circuit in which the actuation voltage of each transistor and the switching probability are different as obvious from the formula for obtaining the variation quantity $\Delta P_N$ of the electric power.

In the embodiments discussed above, the MOS transistor has been explained, however, there may be also a case where the same effect can be obtained with the use for other active devices.

It is apparent that, in this invention, a wide range of different working modes can be formed based on the invention without deviating from the spirit and scope of the invention. This invention is not restricted by its specific working modes except being limited by the appended claims.

What is claimed is:

1. A sizing apparatus for sizing active devices of an integrated circuit, comprising:

storage means for storing information representative of active devices constituting said integrated circuit, connections between said active devices and a delay constraint;

size initializing means for initializing sizes of active devices of said integrated circuit to minimum values;

electric current consumption change rate arithmetic means for calculating a change rate of an electric current consumption of said integrated circuit when the size of an active device of said integrated circuit is increased;

delay calculating means for calculating a maximum signal delay of a signal reaching active devices of a last stage of said integrated circuit by analyzing timing on the basis of the connection information;

delay constraint judging means for judging whether a maximum signal delay of the signal reaching said active devices of the last stage satisfies the delay constraint;

critical path extracting means for extracting a critical path from paths of said integrated circuit that do not satisfy the delay constraint;

delay improvement arithmetic means for calculating an improvement rate of signal delay of the critical path with respect to variation of electric current consumption of said integrated circuit when increasing the size of respective active devices of the critical path;

selecting means for selecting an active device of the critical path having a maximum improvement rate; and control means for selecting a minimum change rate of electric current consumption, for making said electric current consumption change rate arithmetic means calculate a change rate of the electric current when increasing the size of an active device if the selected change rate is zero or less, for making said delay calculating means calculate a signal delay of each path if the selected change rate exceeds zero, for making said delay improvement rate arithmetic means calculate a delay improvement rate if there exists a critical paths and for making said delay calculating means calculate a signal delay when increasing the size of an active device that has been selected by said selecting means.

2. The sizing apparatus according to claim 1, further comprising means for calculating electric current consumption as a sum of charging/discharging currents and short-circuit currents of all active devices of said integrated circuit.

3. A process for sizing active devices of an integrated circuit, comprising:

a first step of setting sizes of said active devices of said integrated circuit to minimize electric current consumption of said integrated circuit;

a second step of judging whether any path of said integrated circuit fails to satisfy a delay constraint by calculating a signal delay of the path and, if there exists no such path, completing the sizing process;

a third step of extracting a critical path having a maximum failure to satisfy the delay constraint;

a fourth step of selecting an active device of the critical path having a maximum improvement in rate of signal delay to variation of electric current consumption when increasing size of said active device; and a fifth step of increasing the size of said selected active device and returning to said second step.

4. The sizing process according to claim 3, wherein said first step includes:

a) setting the sizes of all said active devices of said integrated circuit to minimum values;

b) calculating a change rate of electric current consumption of said integrated circuit when increasing the size of each of said active devices;

c) selecting an active device exhibiting a minimum change rate relative to all active devices of said integrated circuit; and d) executing said step c) by calculating the change rate of electric current consumption when increasing the size of said selected active device if the change rate of electric current consumption of a selected active device is zero or less and finishing said first step if the change rate exceeds zero.

5. The sizing process according to claim 3, wherein the electric current consumption is a sum of charging/discharging currents and short-circuit currents of all active devices of said integrated circuit.

6. An apparatus for sizing active devices of an integrated circuit, comprising:

storage means for storing information representative of active devices constituting said integrated circuit, connections between said active devices and a delay constraint;

size initializing means for initializing sizes of said active devices of said integrated circuit to minimum values;

electric power consumption change rate arithmetic means for calculating a change rate of an electric power consumption of said integrated circuit when the size of an active device of said integrated circuit is increased;

delay calculating means for calculating a maximum signal delay of a signal reaching active devices of a last stage of said integrated circuit by analyzing timing on the basis of the connection information;

delay constraint means for judging whether a maximum signal delay of the signal reaching said active devices of the last stage satisfies the delay constraint;

critical path extracting means for extracting a critical path from paths of said integrated circuit that do not satisfy the delay constraint;

delay improvement arithmetic means for calculating an improvement rate of signal delay of the critical path with respect to variation of electric power consumption of said integrated circuit when increasing the size of each of respective active devices of the critical path;

selecting means for selecting an active device of the critical path having a maximum improvement rate; and control means for selecting a minimum change rate of electric power consumption, for making said electric power consumption change rate arithmetic means calculate a change rate of the electric power when increasing the size of an active device if the selected change rate is zero or less, for making said delay calculating means calculate a signal delay of each path if the selected change rate exceeds zero, for making said delay improvement rate arithmetic means calculate a delay improvement rate if there exists a critical path and for making said delay calculating means calculate a signal delay when increasing the size of an active device that has been selected by said selecting means.

7. The sizing apparatus according to claim 6, further comprising means for calculating the electric power consumption as a total sum of a half of a product of a sum of charging/discharging currents and short-circuit currents flowing across said respective active device, an actuation voltage, an operating frequency and a switching probability.

8. A process for sizing active devices of an integrated circuit, comprising:

a first step of setting sizes of said active devices of said integrated circuit to minimize electric power consumption of said integrated circuit;

a second step of judging whether any of said integrated circuit fails to satisfy a delay constraint by calculating a signal delay of the path and, if there exists no such path, completing the sizing process;

a third step of extracting a critical path having a maximum failure to satisfy the delay constraint;

a fourth step of selecting an active device of the critical path having a maximum improvement in rate of signal delay to variation of electric power consumption when increasing size of said active device; and a fifth step of increasing the size of said selected active device and returning to said second step.

9. The sizing process according to claim 8, wherein said first step includes the steps of:

a) setting the sizes of all active devices of said integrated circuit to minimum values;

b) calculating a change rate of electric power consumption of said integrated circuit when increasing the size of each of said active devices;

c) selecting an active device exhibiting a minimum change rate relative to all active devices of said integrated circuit; and d) executing said step c) by calculating the change rate of electric power consumption when increasing the size of said selected active device if the change rate of electric power consumption of a selected active device is zero or less and finishing said first step if the change rate exceeds zero.

10. The sizing method according to claim 8, wherein the electric power consumption is a half of a total sum of a product of an electric current flowing each of said active devices, an actuation voltage, an operating frequency and a switching probability.

11. The sizing method according to claim 8, wherein the electric power consumption is a total sum of a half of a product of a sum of charging/discharging currents and short-circuit currents flowing said respective active device, an actuation voltage, an operating frequency and a switching probability.

* * * * *